(12) United States Patent
Chi

(10) Patent No.: US 6,262,447 B1
(45) Date of Patent: *Jul. 17, 2001

(54) SINGLE POLYSILICON DRAM CELL AND ARRAY WITH CURRENT GAIN

(75) Inventor: Min-hwa Chi, Hsinchu (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/422,051

(22) Filed: Oct. 20, 1999

Related U.S. Application Data

(63) Continuation-in-part of application No. 09/170,863, filed on Oct. 13, 1998.

(51) Int. Cl.[7] .......................... H01L 27/108; H01L 29/76; H01L 29/94; H01L 31/113
(52) U.S. Cl. .......................... 257/296; 257/336; 257/344; 257/408; 257/322; 257/390
(58) Field of Search ................................. 257/296, 301, 257/202

(56) References Cited

U.S. PATENT DOCUMENTS 5,998,822 * 12/1999 Wada .................................. 257/301
6,087,690 * 7/2000 Chi ..................................... 257/296

* cited by examiner

*Primary Examiner*—Eddie Lee
*Assistant Examiner*—Jesse A Fenty
(74) *Attorney, Agent, or Firm*—Blakely Sokoloff Taylor & Zafman, LLP

(57) ABSTRACT

A two-dimensional array of single polysilicon DRAM cells is disclosed. The array comprises a plurality of DRAM cells arranged in a two-dimensional matrix, wherein each of the DRAM cells comprises: a deep n-well in a silicon substrate; a p-well within the deep n-well; a gate structure over and straddling the deep n-well and the p-well; and a n$^+$ region within the p-well and adjacent to a sidewall of the gate structure. The array is connected together by a plurality of column bitlines, each of the column bitlines connected to the n$^+$ regions of all of the DRAM cells that are in a common column. Further, a plurality of row wordlines are provided, each of the row wordlines connected to the gate structures of all of the DRAM cells that are in a common row.

11 Claims, 7 Drawing Sheets

US 6,262,447 B1

SINGLE POLYSILICON DRAM CELL AND ARRAY WITH CURRENT GAIN

RELATED APPLICATIONS

This is a continuation-in-part of U.S. patent application Ser. No. 09/170,863 filed Oct. 13, 1998 entitled "Single Polysilicon DRAM Cell with Current Gain".

FIELD OF THE INVENTION

The present invention relates to DRAM memory cells, and more particularly, to a DRAM memory cell that can be made with a single polysilicon layer and with current gain.

BACKGROUND OF THE INVENTION

The most commonly used DRAM cell structure is the one transistor/one capacitor cell. This DRAM cell structure typically requires the deposition of three layers of conductive polysilicon: one layer for the gate of the transistor, one layer for the bottom storage node of the capacitor, and a third layer for the top storage node of the capacitor. The relatively complex process required to form modern DRAM cells causes practical incompatibility with standard logic processes that typically use only a single polysilicon layer.

Nevertheless, with the trend towards "system-on-a-chip" devices where memory and logic are placed onto a single chip, it is important to develop a DRAM cell structure that will be compatible with logic. There have been prior art attempts to design a DRAM cell structure that can store information without the benefit of a capacitor. An example of such a DRAM cell is disclosed in "A Novel Merged Gain Cell for Logic Compatible High Density DRAMs," by Mukai et al., Symposium on VLSI Technology Digest of Technical Papers, 1997, at page 155. The DRAM cell disclosed in the Mukai et al. reference shows a single transistor structure that uses $n^+$ and $p^+$ regions formed in p-well and n-wells, respectively. Although this proposed DRAM cell design does address some of the problems of embedded DRAM design, the DRAM cell design proposed by the Mukai et al. reference requires very precise manufacturing processes to ensure that the DRAM cell will operate correctly. In addition, the fabrication process is still relatively complicated.

What is needed is a new design for a DRAM cell that can be used in embedded logic applications.

SUMMARY OF THE INVENTION

A two-dimensional array of single polysilicon DRAM cells is disclosed. The array comprises a plurality of DRAM cells arranged in a two-dimensional matrix, wherein each of the DRAM cells comprises: a deep n-well in a silicon substrate; a p-well within said deep n-well; a gate structure over and straddling said deep n-well and said p-well, said gate structure being a stack of a thin gate oxide layer and a conductive layer; and a $n^+$ region within said p-well and adjacent to a sidewall of said gate structure. The array is connected together by a plurality of column bitlines, each of the column bitlines connected to the $n^+$ regions of all of the DRAM cells that are in a common column. Further, a plurality of row wordlines are provided, each of the row wordlines connected to the gate structures of all of the DRAM cells that are in a common row.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The following detailed description includes two embodiments of a DRAM cell. The first embodiment is described in conjunction with FIGS. 1–7 and the second embodiment is described in conjunction with FIGS. 8–11.

First Embodiment:

The method of manufacturing a first embodiment of the DRAM cell of the present invention is described in conjunction with FIGS. 1–4. The operation of the DRAM cell is described in conjunction with FIGS. 5–7.

Figure 1:
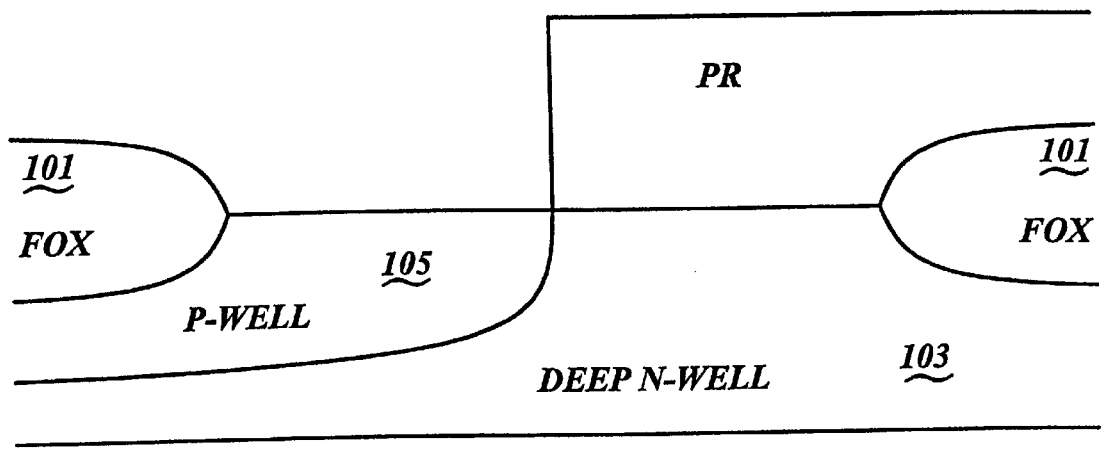
FIGS. 1–4 illustrate in schematic cross-section the steps in forming a DRAM cell in accordance with the present invention.

Turning to FIG. 1, a silicon substrate (preferably p-type having a <100> orientation) is provided for formation of the DRAM cell in accordance with the present invention. Field oxide isolation regions (FOX) 101 are formed using conventional masking and oxidation steps. For example, the FOX regions 101 can be formed via photolithography and dry etching steps to etch a silicon nitride-silicon dioxide composition layer. After the photoresist is removed and the substrate wet cleaned, the FOX regions 101 are grown in an oxygen-steam environment, at a temperature between 850–1050° C., to a thickness of about 4000–6000 angstroms.

After the creation of the FOX regions 101, the silicon nitride-silicon dioxide composition layer is removed by using hot phosphoric acid solution for the silicon-nitride layer, and a buffered hydrofluoric acid solution for the silicon-dioxide. The area between the FOX regions 101 is referred to herein as the "active area" and is the location where the DRAM cell is formed.

Next, a deep n-well 103 is formed in the substrate under the active area by conventional masking, ion implantation, and drive-in. The deep n-well 103 preferably has a depth of 3 microns and has a dopant concentration of approximately $10^{16}/cm^3$. Next, a p-well 105 is formed wholly within the deep n-well 103. The p-well 105 is formed using conventional masking and ion implantation techniques. Preferably, the p-well 105 has a depth of 1.5 microns and has a dopant concentration of $10^{17}/cm^3$.

Next, a gate structure 107 is formed in the active region between the FOX 101. The gate structure 107 is of conventional design and comprises a gate oxide layer 109 and a conductive polysilicon layer 111. The gate structure 107 straddles the lateral termination of the p-well 105 in the deep n-well 103. In other words, the p-well 105 extends under and terminates under the gate structure 107.

Figure 2:
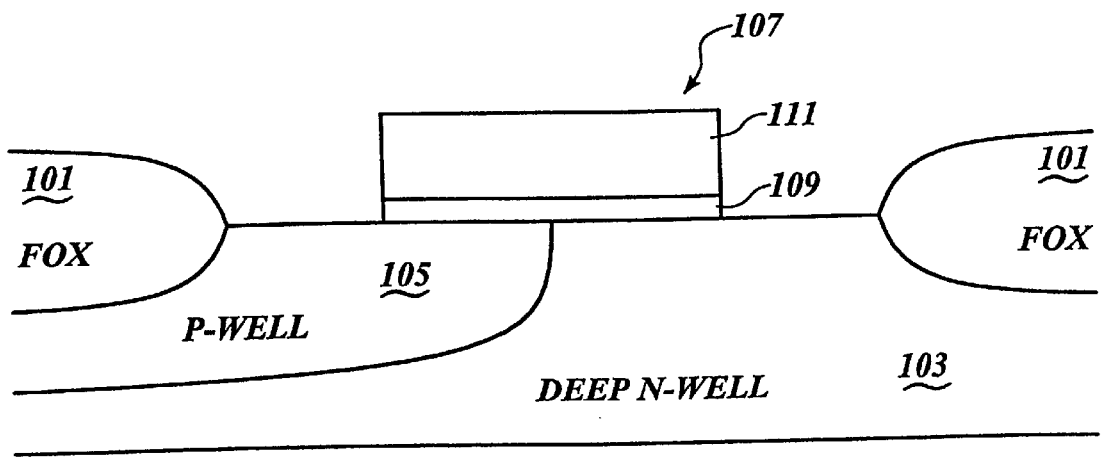

As noted above, the gate structure 107 is of conventional design and can be easily formed by the deposition or growth of the thin gate oxide layer 109 followed by the CVD deposition of a polysilicon layer 111. Preferably, the thin gate oxide layer 109 is under 100 angstroms in thickness to take advantage of the GIDL current effect. Next, conventional photolithography and etching is used to form the gate structure 107. The resultant structure is seen in FIG. 2.

Figure 3:
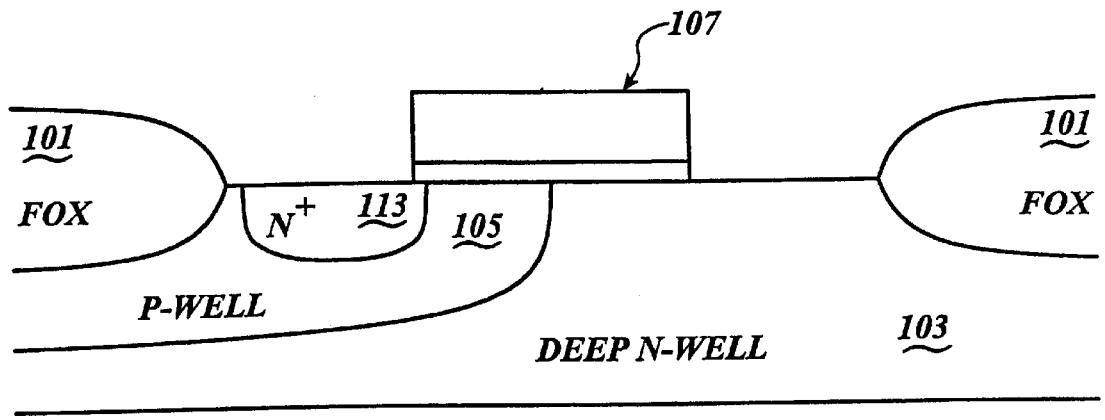

Turning to FIG. 3, a further ion implantation is performed to form an $n^+$ region 113 wholly within the p-well 105. The $n^+$ region 113 is formed between the FOX 101 and one edge of the gate structure 107. Indeed, the $n^+$ region 113 is self-aligned to the gate structure 107 and the FOX 101. The formation of the $n^+$ region 113 can be performed by conventional photolithography masking and ion implantation. Preferably, the $n^+$ region 113 has a depth of 0.4 microns with a dopant concentration of $10^{20}/cm^3$.

Figure 4:
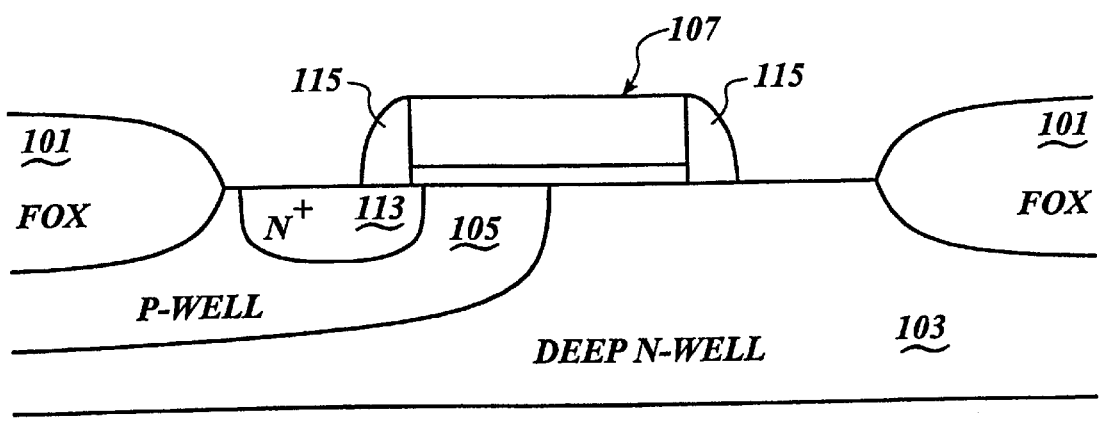

Turning to FIG. 4, sidewall spacers 115 are formed on the sidewalls of the gate structure 107. The sidewall spacers 115 are preferably formed from an oxide and can be formed using conventional techniques such as the deposition of an oxide layer followed by an isotropic etching back process. It can be appreciated that the formation of sidewall spacers 115 is a well known technique.

Figure 5:
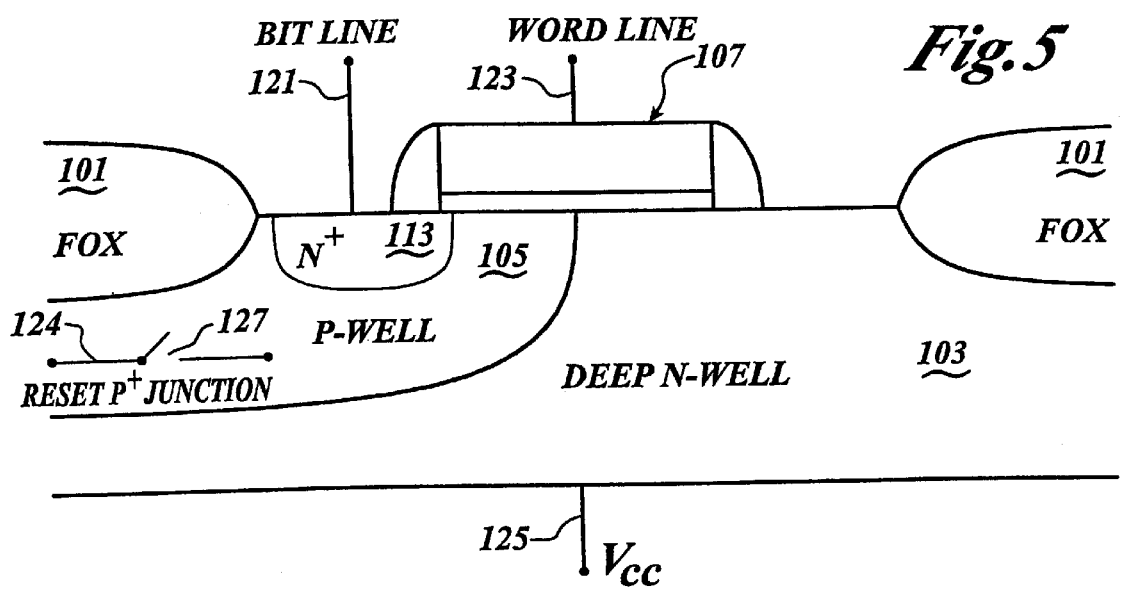
FIG. 5 illustrates in schematic form a completed DRAM cell in accordance with the present invention.

Finally, turning to FIG. 5, the DRAM cell is completed by forming various interconnections with the cell to signal lines or metal interconnects. In particular, a bit line 121 is connected to the $n^+$ region 113. A word line 123 is connected to the gate structure 107. A reset $p^+$ junction 124 is connected to the p-well 125 via a transistor switch 127. Finally, a Vcc line 125 is connected to the deep n-well 103. It should be noted that the various connection lines are only shown in electrical schematic. However, it can be appreciated that the physical formation of the lines would require the deposition of an insulative oxide layer, followed by contact etching, and finally metal filling of the contact holes and formation of the metal interconnect structure. Notice that the above fabrication process is the same as a typical CMOS logic flow with only a single extra masking step for the $n^+$ region 113 implant.

The operation of the present invention will now be described in conjunction with FIG. 5. The DRAM cell of the present invention takes advantage of the phenomena known as gate-induced drain leakage (GIDL) current. The GIDL current typically occurs in thin gate oxide MOS devices and is current between the drain and the substrate. The basis of the GIDL current is band-to-band tunneling that occurs on the surface of the gate-to-drain overlap region. Additional information on GIDL current may be found in "Design for Suppression of Gate-Induced Drain Leakage in LDD MOSFET's Using a Quasi-2-Dimensional Analytical Model," by Parke et al., IEEE Transactions on Electron Devices, Vol. 39, No. 7, July 1992, pp. 694–1702. In that article, the authors explain that an $n^+$ region underneath a gate edge produces a high vertical electrical field that results in hole generation on the surface of an n+ region underneath the gate by band-to-band tunneling in the device.

Returning to FIG. 5, note that the $n^+$ region 113, the p-well 105, and the deep n-well 103 form an n-MOS transistor that is controlled by the word line 123 that straddles the deep n-well 103 and the p-well 105. Digital information is stored in the DRAM cell as voltage potential in the p-well 105. The voltage potential in the p-well 105 acts to modulate the threshold voltage ($V_t$) of the n-MOS transistor.

In order to write digital information into the DRAM cell, a two step method is used. First, referring to FIGS. 5–7, the DRAM cell is reset into the "0" state. The reset $p^+$ junction 124 is biased to a negative potential, for example, $-V_{cc}$. In the preferred embodiment, $V_{cc}$ is 3.3 volts.

Figure 7:
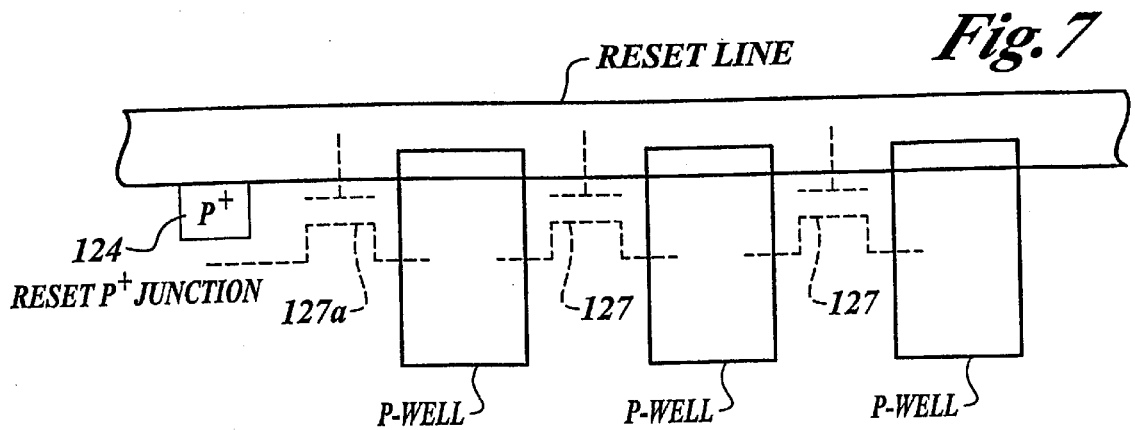
FIG. 7 illustrates a top view of an integrated circuit for the row of DRAM cells of FIG. 6.

As seen in FIG. 7, the transistor switches 127 are implemented as p-channel MOS transistors formed between p-wells of individual DRAM cells. The first transistor switch 127a in a row is formed between the reset $p^+$ junction 124 and the p-well of the first DRAM cell in a row. A reset line is operative to control the transistor switches 127.

Typically, the threshold voltage of the transistor switches 127 is enhancement type (i.e. $V_{tp}$ approximately −1.0 volts with no body bias) in a typical 0.35 micron CMOS technology. The gate of transistor switches 127 are biased low enough using the reset line (e.g. $-V_{cc}$) in order to turn on the p-channel switches 127. It can be appreciated that the above is merely one possible implementation for biasing of the p-wells and other implementations are also possible.

Figure 6:
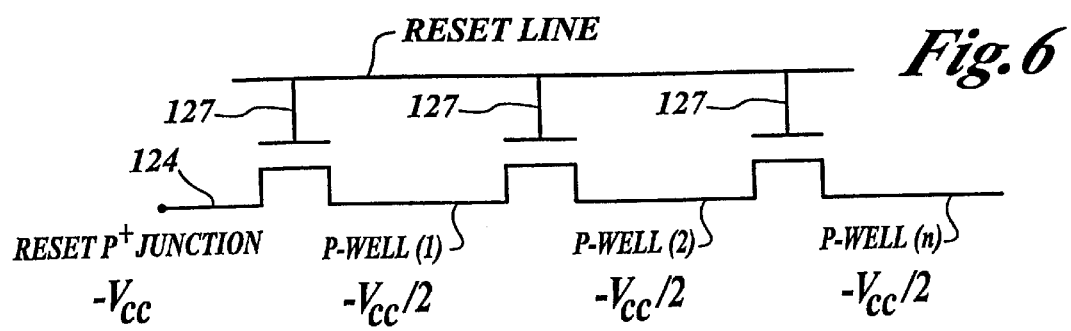
FIG. 6 illustrates an electrical schematic of a row of DRAM cells during the reset operation.

FIG. 6 illustrates the reset operation in more detail, where three p-wells 105 for three DRAM cells aligned in a row. The transistor switches 127 are biased to the "on" position (e.g. $-V_{cc}$) during the reset step using the reset line. This allows each of the p-wells 105 to be biased by the reset $p^+$ junction 124 which carries a voltage of $-V_{cc}$. Because there is a voltage drop ($V_{tp}$) across the first transistor switch 127a, the voltage of the first p-well 105 will be less than $-V_{cc}$ by one $V_{tp}$ value. Note also that the potential of the following p-wells 105 is the same since there is no $V_{tp}$ drop on the following parasitic p-channel transistor switches 127. Because $-V_{cc}$ is nominally −3.3 volts and because a typical value for $V_{tp}$ is 1.5 volts (with body bias), the voltage of the p-well 105 will be approximately −1.8 volts or approximated as $-V_{cc}/2$. After the p-well 105 has reached a steady state voltage, the switches 127 are "opened" using the reset line (e.g. applying 0.0 volts to the reset line), allowing the potential of the p-well 105 to "float" at approximately $-V_{cc}/2$.

Next, in the second step of the write operation, after the DRAM cell has been reset to the "0" state, selected DRAM cells in the DRAM array may be written to a "1" state by applying $-V_{cc}/2$ on the word line and $V_{cc}/2$ on the bit line. This causes GIDL current to flow into the p-well 105, thereby changing the p-well 105 voltage from $-V_{cc}/2$ to near the bit-line potential of $V_{cc}/2$.

The bit lines of cells that are to remain in the 0 state are biased at 0 volts, such that there is not enough voltage drop from the gate 107 to the $n^+$ region 113 for GIDL current generation. After this writing procedure, those DRAM cells that hold a 0 state have their p-well 105 at a potential $-V_{cc}/2$ and those cells with a 1 state have their p-well 105 potential at $V_{cc}/2$.

For the read operation, it should be noted that digital information of the 0 state and 1 state in each DRAM cell is represented by the p-well 105 bias at $-V_{cc}/2$ or $V_{cc}/2$, respectively. Therefore, the threshold voltage of the parasitic n-channel MOS transistor ($n^+$/p-well/deep n-well) is either large, for example, $V_{cc}/2$ or small, such as 0.5 volt, due to the "body bias effect" of the p-well potential at $-V_{cc}/2$ and $V_{cc}/2$, respectively. Therefore, under the bias of read operation where the bit line is set to Vcc/2 and the wordline is set to $V_{cc}$, the cell current flowing from the deep n-well 103 through the channel to the bit line is either large or negligible as modulated by the p-well 105 bias. By measuring the amount of current flow, it can be determined the memory state of the DRAM cell. For example, if a large current flows, this indicates that the p-well is biased at $V_{cc}/2$ and that the memory state is "1". If a small current flows, this indicates that the p-well 105 is biased at $-V_{cc}/2$ and that the memory state is "0". Note also that the read operation is non-destructive, i.e., the charge in the p-well 105 is not consumed by the read operation.

In an alternative embodiment, different biasing voltages may be applied. For example, during the write function, the DRAM cell is reset into the "0" state by biasing the gate of the transistor switches 127 (using the reset line) to a negative potential of $-(3/2)V_{cc}$, which is more negative than the reset p$^+$ junction 124 biased at $-V_{cc}$ by at least one $V_{tp}$ value. Because the gate of transistor switches 127 are biased low enough, there is no $V_{tp}$ drop across the first transistor switch 127a and therefore all p-wells are biased the same as the reset p$^+$ junction 124 (i.e. $-V_{cc}$). After the p-well 105 has reached a steady state voltage, the switch 127 is "opened" by applying 0.0 volts to the reset line, allowing the potential of the p-well 105 to "float" at approximately $-V_{cc}$.

Next, in the second step of the write operation, after the DRAM cell has been reset to the "0" state, selected DRAM cells in the DRAM array may be written to a "1" state by applying $-V_{cc}$ on the word line and 0 volts on the bit line. This causes GIDL current to flow into the p-well 105, thereby changing the p-well 105 voltage from $-V_{cc}$ to near 0 volts in this alternative embodiment. After the writing procedure, those DRAM cells that hold a 0 state have their p-well 105 at a potential $-V_{cc}$ and those cells with a 1 state have their p-well 105 potential at near 0 volts.

For the read operation, it should be noted that digital information of the 0 state and 1 state in each DRAM cell is represented by the p-well 105 bias at $-V_{cc}$ or 0 volts, respectively. Therefore, under the bias of read operation where the bit line is set to 0 volts and the wordline is set to $V_{cc}$, the cell current flowing from the deep n-well 103 through the channel to the bit line is either large or negligible as modulated by the p-well 105 bias. By measuring the amount of current flow, it can be determined the memory state of the DRAM cell. Note also that the read operation is again non-destructive, i.e., the charge in the p-well 105 is not consumed by the read operation.

Second Embodiment:

The DRAM cell described above can be further improved so that the p-wells of each cell can be reset to $-V_c$. by simply biasing the n$^+$ regions 113 (the bitlines) to $-V_{cc}$, so that the p-well 105 potential is clamped to $-V_{cc}$. In this way, the reset line 124 and the parasitic pMOS transistors 127 can be eliminated. This results in a smaller cell size.

Figure 8:
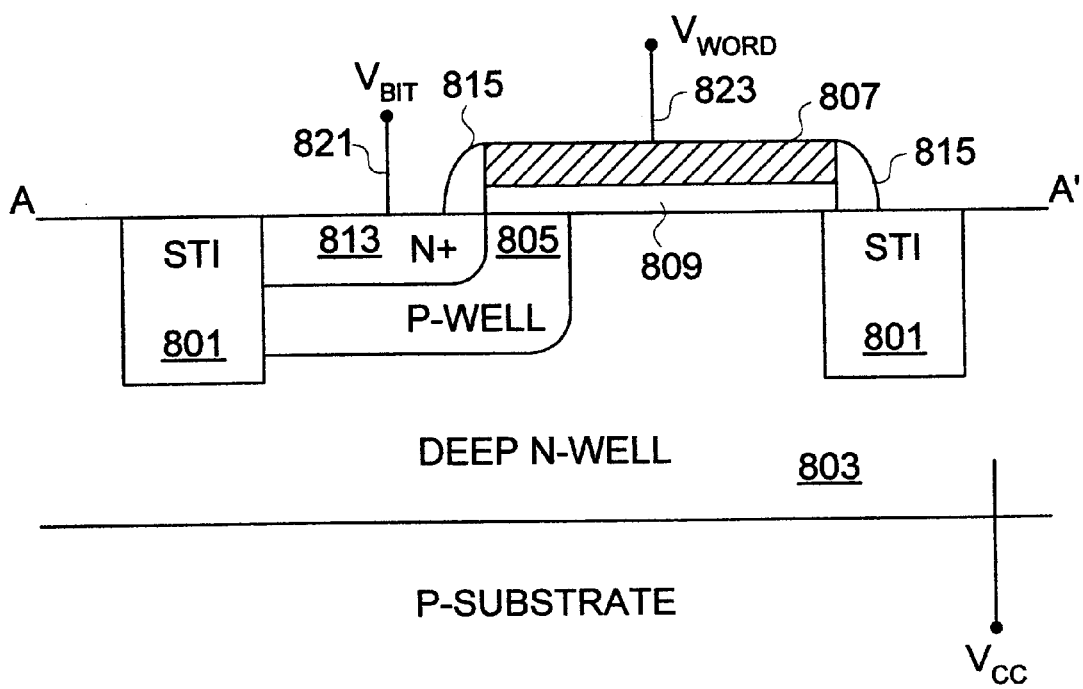
FIG. 8 illustrates a DRAM cell in accordance with an alternate embodiment of the present invention
Figure 9:
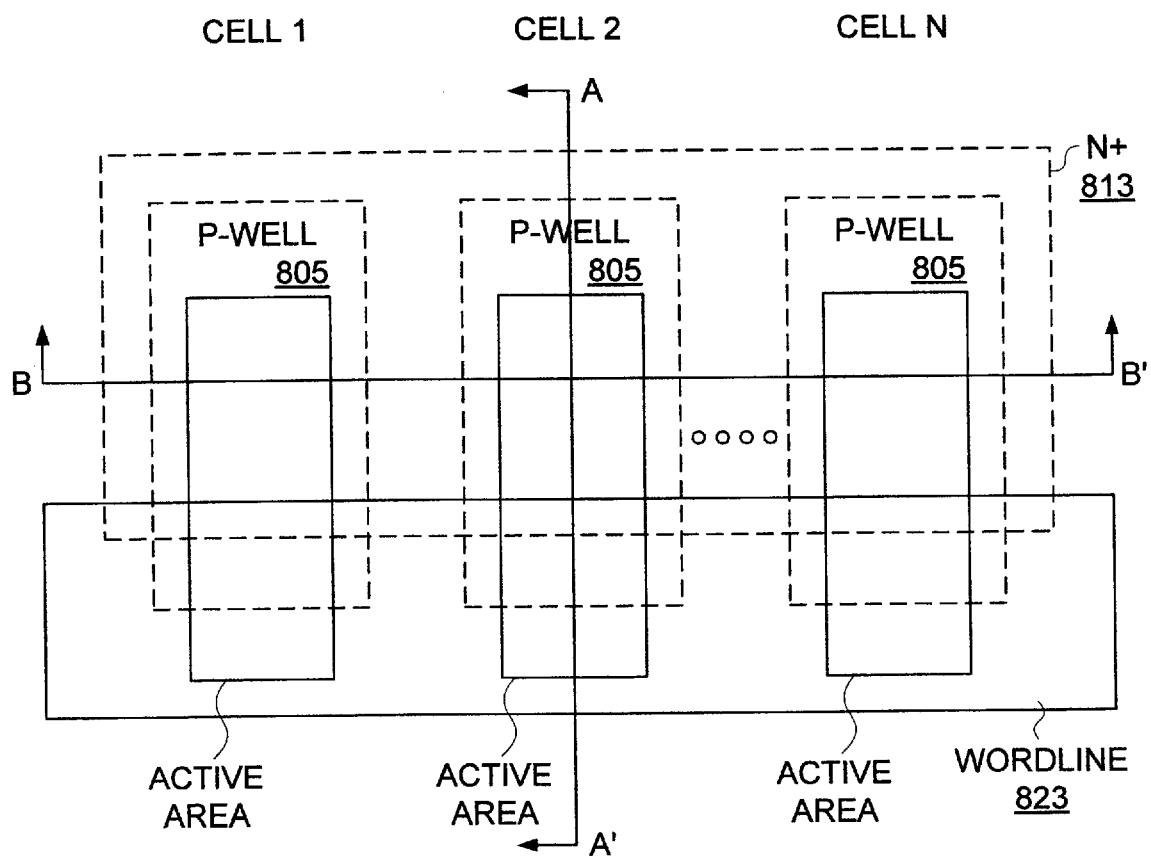
FIG. 9 illustrates a top view of a row of DRAM cells of FIG. 8.
Figure 10:
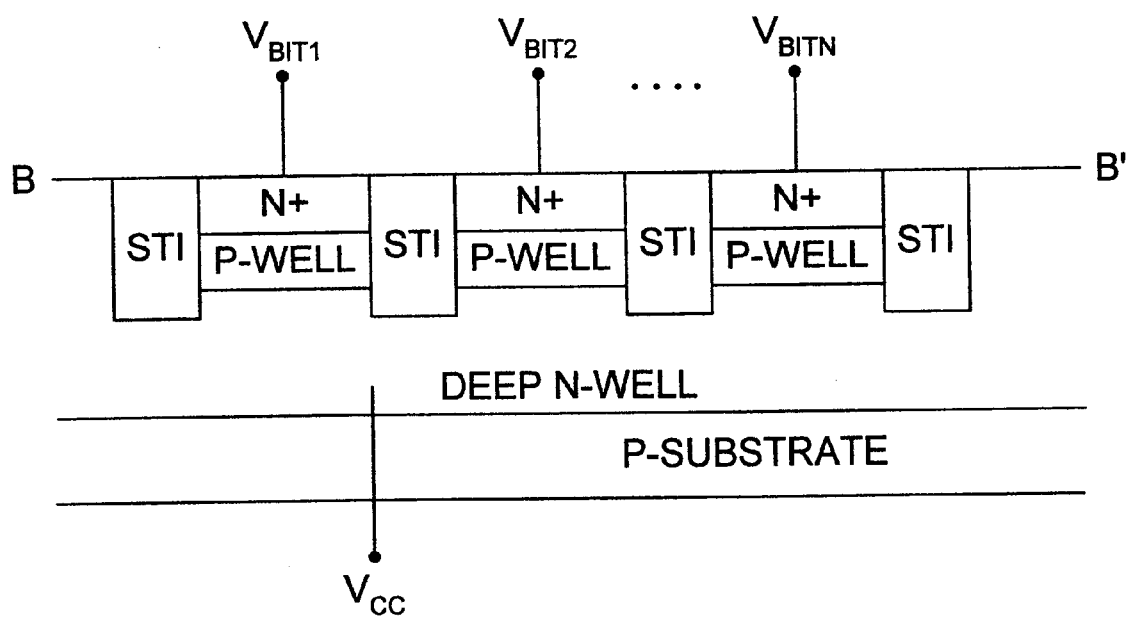
FIG. 10 illustrates a cross section view taken along line B–B' of FIG. 9.

FIGS. 8–10 show various views of the DRAM cell array of this alternate embodiment. FIG. 8 shows in cross section a single DRAM cell of this alternate embodiment. This embodiment is substantially similar to the embodiment shown in FIG. 5 except that shallow trench isolations (STI) 801 are used to isolate the cells instead of a field oxide (FOX).

A deep n-well 803 is formed in the substrate under the active area by conventional masking, ion implantation, and drive-in. The deep n-well 803 preferably has a depth of 3 microns and has a dopant concentration of approximately $10^{16}/cm^3$. Next, a p-well 805 is formed wholly within the deep n-well 803. The p-well 805 is formed using conventional masking and ion implantation techniques. Preferably, the p-well 805 has a depth of 1.5 microns and has a dopant concentration of $10^{17}/cm^3$.

Next, a gate structure 807 is formed in the active region between the STIs 801. The gate structure 807 is of conventional design and comprises a gate oxide layer 809 and a conductive polysilicon layer. The gate structure 807 straddles the lateral termination of the p-well 805 in the deep n-well 803. In other words, the p-well 805 extends under and terminates under the gate structure 807.

A further ion implantation is performed to form an n$^+$ region 813 wholly within the p-well 805. The n$^+$ region 813 is formed between the STIs 801 and one edge of the gate structure 807. Indeed, the n$^+$ region 813 is self-aligned to the gate structure 807. The formation of the n$^+$ region 813 can be performed by conventional photolithography masking and ion implantation. Preferably, the n$^+$ region 813 has a depth of 0.4 microns with a dopant concentration of $10^{20}/cm^3$.

Next, sidewall spacers 815 are formed on the sidewalls of the gate structure 807. The sidewall spacers 815 are preferably formed from an oxide and can be formed using conventional techniques such as the deposition of an oxide layer followed by an isotropic etching back process.

Next, a bit line 821 is connected to the n$^+$ region 813 and a word line 823 is connected to the gate structure 807. Finally, a $V_{cc}$ line 825 is connected to the deep n-well 803. It should be noted that the various connection lines are only shown in electrical schematic. However, it can be appreciated that the physical formation of the lines would require the deposition of an insulative oxide layer, followed by contact etching, and finally metal filling of the contact holes and formation of the metal interconnect structure. Notice that the above fabrication process is the same as a typical CMOS logic flow with only a single extra masking step for the n$^+$ region 813 implant.

A top view of a row of DRAM cells of FIG. 8 is shown in FIG. 9. Note that FIG. 8 is a cross section taken along line A—A' of FIG. 9. Similarly, FIG. 10 is a cross section taken along line B—B' of FIG. 9. From FIG. 9, it is seen that the reset line 124 and the parasitic transistors 127 of the first embodiment are eliminated.

The cell operation is similar to the first embodiment, except for the reset 35 operation. Note that during all operations, the deep n-well is biased to $V_{cc}$. The p-wells of each cell can be reset to $-V_{cc}$ by simply biasing the bit-line to $-V_{cc}$. This results in the p-well potential of all cells in the same bit-line to be pulled down to $V_{cc}$ due to the forward-biased (p-well to n$^+$ bitline) junction. In this way, the reset line and the parasitic p-well transistors of the first embodiment are eliminated, and the cell size is further reduced. Note that the reset operation of this embodiment resets all cells along the same bitline, while the reset operation in the first embodiment resets all cells along the same wordline.

The single cell write operation of the DRAM cell is a two step operation. First, the p-well of the cell to be written to is reset to $-V_{cc}$ by simply biasing the bitline ($V_{bit}$) to $-V_{cc}$ (i.e. the p-well potential is pulled down to $-V_{cc}$ due to the forward biased junction). Then, if a "1" is to be written, the wordline $V_{word}$ is biased to $-V_{cc}/2$ and the bitline ($V_{bit}$) is biased to $V_{cc}/2$. This results in holes on the n$^+$ region 813 to flow into the p-well until the voltage in the p-well becomes approximately $V_{cc}/2$. Note that with $V_{word}$ equal to zero volts, the voltage potential in the p-well is unchanged.

The single cell read operation is the same as in the first embodiment of the DRAM cell. Digital information of the 0 state and 1 state in each DRAM cell is represented by the p-well 805 bias at $-V_{cc}$ or $V_{cc}/2$ volts, respectively. Therefore, under the bias of read operation where the bit line is set to between 0 to $V_{cc}/2$ volts and the wordline is set to $V_{cc}$, the cell current flowing from the deep n-well 103 through the channel to the bit line is either large or negligible as modulated by the p-well 805 bias. Note that in the first embodiment, the bitline was set to $V_{cc}/2$ corresponding to p-well potentials of $V_{cc}/2$ and $-V_{cc}/2$. However, in the second embodiment described here, a larger p-well extreme potentials of $-V_{cc}$ and $V_{cc}/2$ are used. This allows the bitline bias set in the range of 0 to $V_{cc}/2$ and still result in successful read operation. By measuring the amount of current flow, it can be determined the memory state of the DRAM cell. Note also that the read operation is again non-destructive, i.e., the charge in the p-well 805 is not consumed by the read operation.

Figure 11:
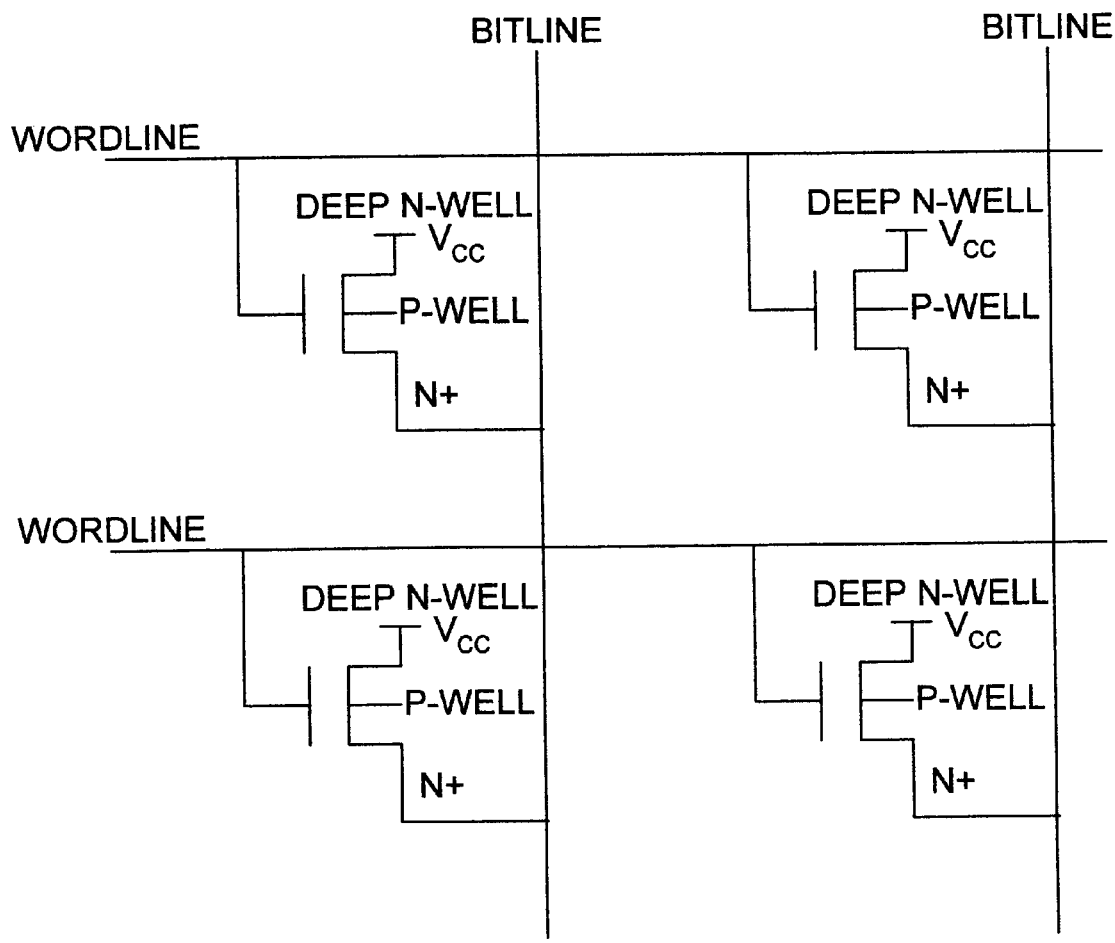
FIG. 11 is a electrical schematic of an array of DRAM cells formed from the cells of FIG. 8.

An array of the DRAM cells can be seen in FIG. 11. Note that the gate structures 807 of all cells in a row are connected to a row wordline. Similarly, the n⁺ regions 813 of all cells in a column are connected to a column bitline. Each of the cells p-wells 805 are left floating to store the digital information in the form of a body bias voltage. Finally, the common deep n-well to all of the cells are biased to $V_{cc}$.

The array can be written to digital information in one of two schemes. First, the array can be written to bitline by bitline. This scheme is useful for the refreshing operation. Specifically, this scheme begins by writing a "0" to all cells in one column by applying a voltage $V_{BLn}$ of $-V_{cc}$ for the selected bitline and zero volts for all other bitlines. Next, a "1" or a "0" can be written to the individual cells in the column by applying a voltage $V_{BLn}$ of $V_{cc}$ to the selected bitline ($V_{BLn}$ is zero volts for all other bitlines). The row wordlines voltages $V_{WLm}$ are biased to $-V_{cc}/2$ for writing a "1" and are biased to zero volts for writing a "0". The above steps are repeated for each column bitline in the array.

In the second scheme, the full array can be reset before writing. This scheme is useful for fast page write operation. Specifically, this scheme begins by writing a "0" to all cells in all columns by applying a voltage $V_{BLn}$ of $-V_{cc}$ for all of the column bitlines. Next, individual column bitlines in the array are sequentially processed. A "1" or a "0" can be written to the individual cells in the column by applying a voltage $V_{BLn}$ of $V_{cc}/2$ to the current selected bitline ($V_{BLn}$ is zero volts for all other bitlines). The row wordlines voltages $V_{WLm}$ are biased to $-V_{cc}/2$ for writing a "1" and are biased to zero volts for writing a "0". The writing step is repeated for each column bitline in the array.

While the preferred embodiment of the invention has been illustrated and described, it will be appreciated that various changes can be made therein without departing from the spirit and scope of the invention. For example, the polarity of the silicon can be reversed. The n⁺ well can be replaced with a p+well and the p-well can be replaced with a n-well.

The embodiments of the invention in which an exclusive property or privilege is claimed are defined as follows:

1. A two-dimensional array of single polysilicon DRAM cells comprising:
   a plurality of DRAM cells arranged in a two-dimensional matrix, each of said DRAM cells comprising:
   (1) a deep n-well in a silicon substrate;
   (2) a p-well within said deep n-well;
   (3) a gate structure over and straddling said deep n-well and said p-well, said gate structure being a stack of a thin gate oxide layer and a conductive layer; and
   (4) a n⁺ region within said p-well and adjacent to a sidewall of said gate structure;
   a plurality of column bitlines, each of said plurality of column bitlines connected to the n⁺ regions of all of said DRAM cells that are in a common column;
   a plurality of row wordlines, each of said plurality of row wordlines connected to the gate structures of all of said DRAM cells that are in a common row.

2. The array of claim 1 further including a conductive $V_{cc}$ line connected to said deep n-well.

3. The array of claim 1 wherein:
   in order to read a selected DRAM cell, said column bitline connected to said selected DRAM cell is biased to zero volts and said row wordline connected to said selected DRAM cell is biased to $V_{cc}$.

4. The array of claim 1 wherein:
   in order to write a zero state to a selected DRAM cell in said array, said column bitline connected to said selected DRAM cell is biased to $-V_{cc}$;
   in order to write a one state to said selected DRAM cell, said column bitline connected to said selected DRAM cell is biased to $V_{cc}/2$ and said row wordline is biased to $-V_{cc}/2$.

5. The array of claim 1 wherein the array can be written to in a column by column manner by:
   (1) biasing a one of said plurality of column bitlines to $-V_{cc}$ as a currently biased column bitline in order to write a "0" to the column of DRAM cells connected to the currently biased column bitline;
   (2) in order to write a "1" to a selected DRAM cell in the column of DRAM cells connected to said currently biased column bitline, biasing said currently biased column bitline to $V_{cc}/2$ and biasing the row wordline connected to said selected DRAM cell to $-V_{cc}/2$; and
   (3) repeating steps (1)–(2) for each of the remaining plurality of column bitlines.

6. The array of claim 1 wherein the array can be written to by:
   (1) biasing said plurality of column bitlines to $-V_{cc}$ in order to write a "0" to said plurality of DRAM cells; and
   (2) in order to write a "1" to a selected DRAM cell, biasing the column bitline connected to said selected DRAM cell to $V_{cc}/2$ and biasing the row wordline connected to said selected DRAM cell to $-V_{cc}/2$.

7. A single polysilicon DRAM cell comprising:
   a deep n-well in a silicon substrate;
   shallow trench isolations formed in said deep n-well to form an active area;
   a p-well within said deep n-well and within said active area;
   a gate structure over a portion of said active area, said gate structure straddling said deep n-well and said p-well, said gate structure being a stack of a thin gate oxide layer and a conductive layer; and
   a n⁺ region within said p-well and adjacent to a sidewall of said gate structure.

8. The cell of claim 7 further including a bitline connection to said n⁺ well and a wordline connection to said conductive layer of said gate structure.

9. The cell of claim 7 further including a conductive $V_{cc}$ line connected to said deep n-well.

10. The cell of claim 8 wherein in order to read said cell, said bitline connection is biased to zero volts and said wordline connection is biased to $V_{cc}$.

11. The cell of claim 8 wherein in order to write a zero state to said cell, said bitline connection is biased to $-V_{cc}$ and in order to write a one state to said cell, said bitline connection cell is biased to Vcc/2 and said wordline connection is biased to $-V_{cc}/2$.

* * * * *